HIGH FREQUENCY SHIELDING AND SEALING GASKET

Filed Oct. 28, 1966 2 Sheets-Sheet 1

INVENTORS
CHARLES J. DAUBENBERGER
BILL J. BRYANT
BY
*Elliott & Pastoriza*
ATTORNEYS INVENTORS
CHARLES J. DAUBENBERGER
BILL J. BRYANT
BY
Elliott & Pastoriza
ATTORNEYS 3,371,147
HIGH FREQUENCY SHIELDING AND SEALING GASKET Charles J. Daubenberger, Van Nuys, and Bill Joe Bryant, El Segundo, Calif., assignors to DA/Pro Rubber Company, Incorporated, a corporation of California Filed Oct. 28, 1966, Ser. No. 590,319
3 Claims. (Cl. 174—35)

ABSTRACT OF THE DISCLOSURE

This disclosure relates to a radio frequency sealing gasket comprising a flexible sheet of conducting material having a central opening, the annular edge of the opening turning out of the plane of the remaining surface of the sheet and thence radially extending towards the center to define an annular flat surface lying in a plane parallel to and spaced a given distance from the plane of the remaining surface. First and second flat members of resilient material of a thickness corresponding to the given distance are secured to opposite sides of the flexible sheet about the central opening and provide proper sealing. The displaced planes of the conducting sheet provide intimate contact with surfaces to be secured together and yet the structure is such that the entire gasket may flex to accommodate any unevenness in the engaging surfaces involved.

This invention relates generally to electronic equipment and more particularly to an improved high frequency shielding gasket for providing improved shielding of radio frequency signals and the like around panel mounting surfaces for various panel openings, connectors, and coupling connectors themselves.

Normally, shielding of radio and other frequency energy between various different pieces of electronic equipment is provided by properly constructing the enclosing cabinet for the equipment of conducting metal. As to various cables interconnecting components of the equipment, suitable shielding is provided about these cables. However, there can still result leakage of R.F. energy and thus interference between the various pieces of equipment, at the mounting points of connection of cables to the panels of the equipment as well as around panel lids or other closures.

In effecting connections from multiple wires in a single cable, cannon type plugs and sockets are usually employed. Since the individual conductors must be insulated from each other, there is provided insulating material in both the male and female portions of the connectors. To avoid any radio frequency leakage of energy at the connection points, it is necessary that the outer shielding conductor of the cable be in intimate metallic contact with the metal of the other cable connection coupling or to the mounting panel or other cabinet housing wall enclosing the particular unit.

In the case of panel connections, in many instances the cabinet panel for mounting connectors is of extremely thin metal and subject to warping. This warping or uneven surface can result in small air voids between the shielding for the connector and the metal surface of the panel itself when a connection is made and can thus result in radio frequency leakage when a conventional type metallic washer is employed. To assure against any radio frequency leakage, it is desirable that there be 360° metallic contact between the connector and the mounting panel surface; that is, that there be proper grounding. On the other hand, it is important that the connector be in fluid tight engagement with the panel to prevent leakage of gases in and out of the unit or moisture in and out of the unit. This latter requirement necessitates some type of flexible sealing gasket and various structures heretofore provided may flex in such a manner as to prevent the desired 360° metallic or conductive relationship between the connector and the panel. Similar considerations apply to proper shielding of cabinet lids and doors, and to interconnections between cables.

With the foregoing considerations in mind, it is a primary object of this invention to provide a vastly improved radio frequency shielding gasket in which the problems outlined above are substantially overcome.

More particularly, it is an object to provide an improved radio frequency shielding gasket which assures complete 360° metallic or conductive contact between a connector and a mounting panel notwithstanding that the panel itself may be warped or uneven and yet which additionally assures a fluid type or moisture proof seal, all to the end that interference between adjacent pieces of equipment is avoided and proper sealing is provided.

Other objects of this invention are to provide a radio frequency shielding gasket providing proper sealing and grounding of the shielding element for use in panel lids, inter-cable connections, and similar environments.

Briefly, these and many other objects and advantages of this invention are attained by providing a thin flexible sheet of highly conducting material in combination with an insulating material such as rubber or equivalent elastomer, together with suitable means for assuring proper grounding of the conductive material. In the case of a panel connector gasket, the sheet is provided with a central opening, the annular edge portion of the sheet defining the opening being displaced into a plane parallel to and spaced a given distance from the remaining portion of the sheet in such a manner that the interconnecting portion of the sheet between the two planes can assume an S shape when viewed in cross section in a direction parallel to the plane of the gasket. In other words, the displaced surface portion functions to effect 360° metallic contact with a portion of the connector and the remaining surface portion effects 360° metallic contact with a panel or other unit wall to which the connector is mounted and yet a degree of flexibility is afforded by the interconnection between the two surfaces to accommodate any unevenness in the panel surface.

In the foregoing embodiment of the invention, the insulating material includes first and second resilient members made, for example, of rubber or other suitable sealing material secured to the respective surface portions of the sheet opposite the surface portions engaging in metallic contact the connector and panel. These members function to support the thin resilient sheet of metal in its desired configuration and will accommodate various uneven portions in the panel structure, the metal surfaces of the resilient sheet following the shape assumed by the resilient members. Further, these resilient members function as fluid tight or moisture proof seals for the gasket.

In further embodiments, the gasket includes a simple combination of a thin conducting metallic shield with an insulating sheet on one surface or alternatively sandwiching the shield, together with means for assuring proper grounding of the shield.

A better understanding of the invention will be had by now referring to the preferred embodiments thereof as illustrated in the accompanying drawings, in which.

Figures 1, 2:
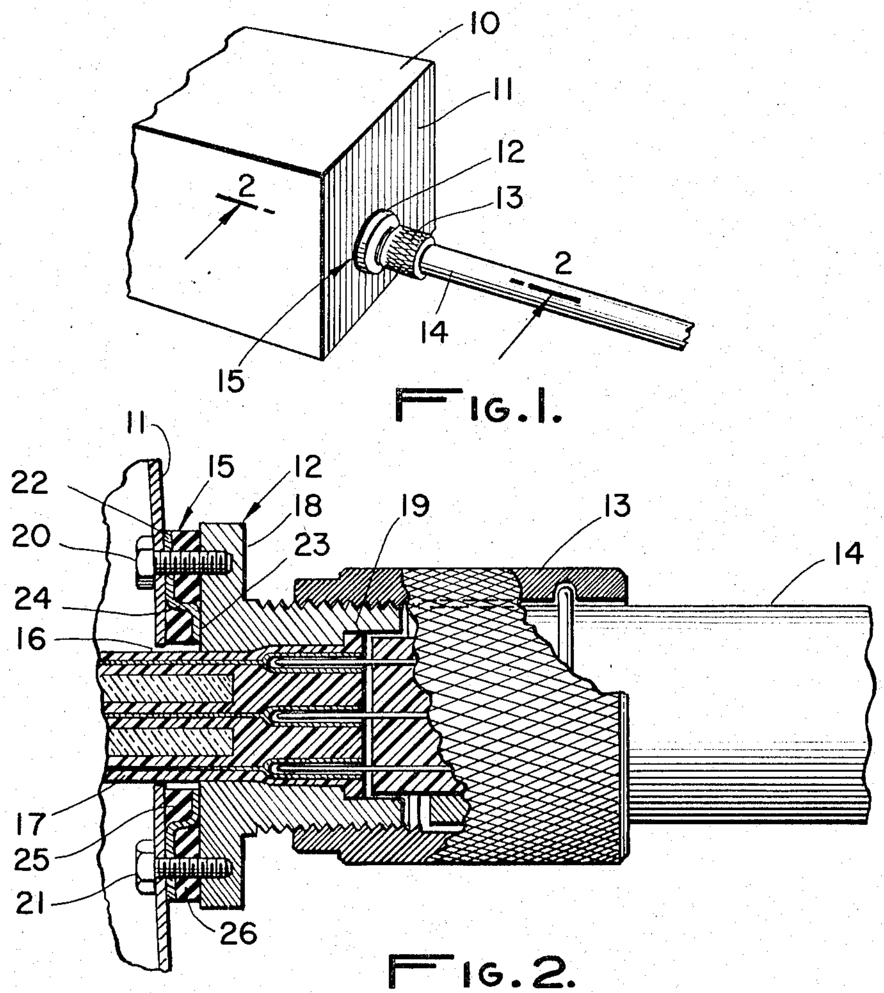
FIGURE 1 is a fragmentary perspective view of a typical connector secured to the panel of a cabinet for high frequency electronic equipment wherein the improved high frequency shielding gasket of this invention is employed.
FIGURE 2 is a greatly enlarged fragmentary view, partly in cross section, taken in the direction of the arrows 2—2 of FIGURE 1.

Referring first to FIGURE 1 there is shown cabinet 10 for radio frequency or other electronic equipment wherein there is provided a front mounting panel 11. A female portion of a connector 12 is mounted on the panel 11 and is shown connected to a coupling sleeve 13 on a connecting cable 14. The radio frequency shielding gasket of this invention is designated generally by the arrow 15 and is sandwiched between a surface of the female connector 12 and the front face of the panel 11.

Referring now to FIGURE 2, the cross-sectional view illustrates the panel 11 as being slightly warped as might well be the case in practice. The panel 11 is provided with an opening 16 for accommodating a body portion 17 of the female connector 12. This body portion includes an enlarged mounting flange 18 and reduced diameter nose portion 19 provided with suitable external threads for receiving the sleeve 13 of the connecting cable 14 in the usual manner. Suitable screws such as indicated at 20 and 21 pass from the inside of the panel 11 into the annular flange 18 of the female connector as shown.

The gasket 15 is illustrated in detail in sandwiched position between the surface of the connector 12 and the surface of the panel 11. As shown, this gasket includes a thin resilient sheet of conductive material including a portion 22 engaging the panel 11 and having a displaced annular flat surface portion 23 defining a central opening for accommodating the body portion 17 of the female connector 12. Intermediate the surface portion 22 of the thin sheet and the annular flat displaced portion 23 there is provided an intermediate portion 24 integrally connecting these two surfaces.

It will be evident from FIGURE 2 that the surface portions 22 and 23 lie in parallel planes spaced from each other by a given distance. A first resilient member of sealing material such as rubber is secured to the underside of the annular flat surface portion 23 as indicated at 25. This resilient member may be generally washer shaped. A second resilient member in turn is secured to an under surface of the remaining portion 22 of the resilient sheet as indicated at 26. The free surfaces of the members 25 and 26 are substantially co-extensive with the metallic contact engaging surfaces of the portions 22 and 23 respectively.

It will be evident from FIGURE 2, that upon tightening of the screws 20 and 21 to urge the flange 18 towards the panel 11 and thus exert a force normal to the plane of the surfaces 22 and 23 of the gasket, a partial collapsing of the gasket will take place, the intermediate connecting portion 24 assuming a general S shape. Further, this compression force is accommodated by the resilient rubber members 25 and 26. In this respect, these rubber or insulating resilient members serve to support the thin sheet portions 22 and 23 so that these portions will follow essentially any deformation of the rubber members. Thus unevenness in the panel surface such as the warped shape as illustrated in FIGURE 2 will not prevent a complete 360° contact between the portion 22 of the resilient sheet engaging the panel surface 11 or the annular flat portion 23 of the sheet engaging the surface of the female connector 12. In addition, it will be evident that the resilient members provide a double moisture proof seal.

Figure 3:
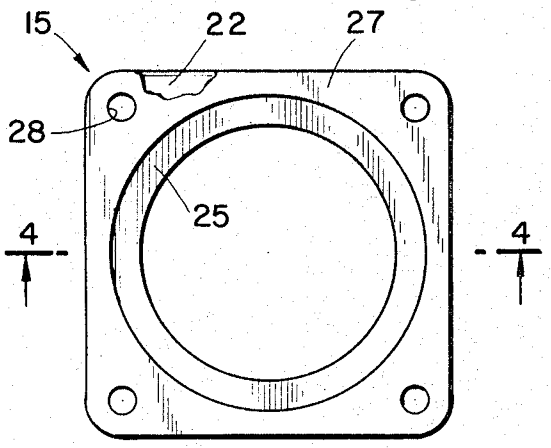
FIGURE 3 is a plan view of the shielding gasket.

In the plan view of FIGURE 3, it will be noted that the gasket is of generally square shape insofar as its external outline is concerned. However, this square shape is merely for the particular embodiment disclosed and could be circular if desired. It will also be noted in FIGURE 3 that the surface 22 is coated with an inert metal 27. This metallic coating is desirable if the material making up the thin sheet is different from the material of the panel 11 in order to avoid direct contact between dissimilar metals. However, if the material of the sheet portion 22 is the same as the material of the panel 11, the coating 27 may be eliminated.

In FIGURE 3, the sheet and insulating member 26 are provided with suitable openings such as indicated at 28 to accommodate the screws 20 and 21. In accord with a feature of the invention, these openings are made purposely smaller in diameter than the external diameter of the screws in order that force threading of the screw through the openings is required. By this arrangement, there is assured complete metallic contact over 360° between the external surface of the screw and the sheet as well as proper grounding to the panel.

Figure 4:
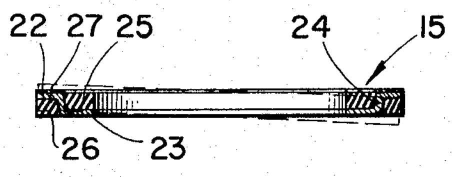
FIGURE 4 is a cross section taken in the direction of the arrows 4—4 of FIGURE 3.

In the cross section of FIGURE 4, it will be evident from the dotted line showing that the gasket may be distorted to accommodate the unevenness of the panel 11 as described in FIGURE 2. Also, the general S shape of the intermediate connecting portion 24 between the sheet surfaces 22 and 23 will be evident.

Figure 5:
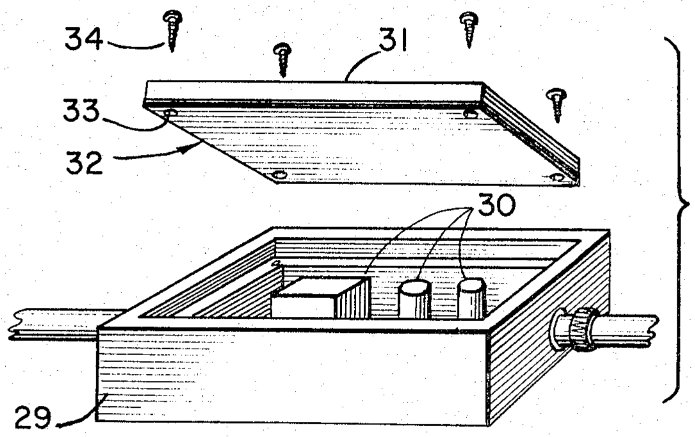
FIGURE 5 is an exploded perspective view of a cabinet and lid structure incorporating a modified embodiment of the gasket of this invention.

Referring now to FIGURE 5, there is illustrated a cabinet 29 for suitable electronic equipment 30. As shown, there is provided a conventional panel lid 31. In accord with a modified embodiment of the invention, the lid is provided with a shielding gasket 32 on its bottom surface. Suitable screw holes such as 33 are provided for fastening screws 34 to secure the lid 31 to the top of the cabinet 29.

Figure 6:
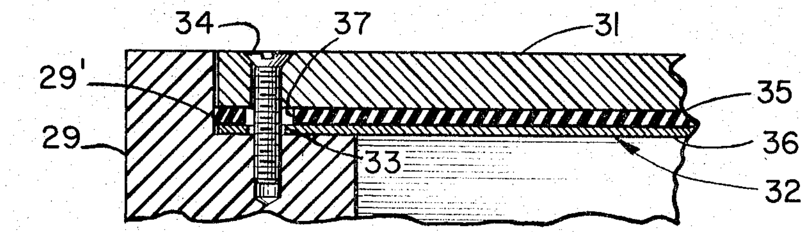
FIGURE 6 is a enlarged fragmentary cross section of a portion of the cabinet, lid, and gasket structure illustrated in FIGURE 5 with the lid in place.

Referring to FIGURE 6, details of the gasket 32 will be evident. As shown, the gasket structure includes a thin insulating elastomer such as rubber 35 together with a thin metallic sheet 36 of highly conductive material. The rubber insulating material 35 is provided with openings by simply removing portions of it from the sheet 36 to accommodate the screws such as the screw 34. In addition, the opening 33 in the metallic portion 36 of the sheet is purposely made of smaller diameter than the screw 34 so that a force fit through the metallic sheet 36 is necessary. Accordingly, 360° engagement of the external surface of the screw with the metallic sheet takes place.

Tightening of the various screws such as the screw 34 serves to squeeze out some of the elastomer 35 to abut the adjacent flange edge of the cabinet lip as at 29' thereby assuring a moisture and pressure tight seal. The direct contact of the metallic sheet 36 itself with the cabinet opening and the force fitting of the metallic screw 34 assures proper grounding of the conducting metallic sheet 36 and lid so that proper shielding is assured about the entire margin of the opening.

Figure 7:
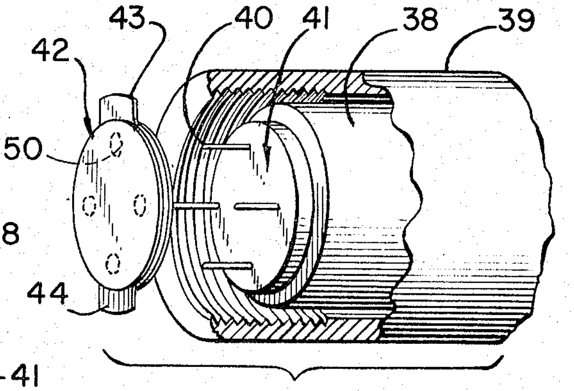
FIGURE 7 is a broken away perspective view of a cable connector and a further embodiment of a shielding gasket structure shown separated from the connector preparatory to inserting the same in the connector.

Referring now to FIGURE 7 there is shown a cable connector portion 38 including a tightening sleeve 39 similar to the cable portion 14 and sleeve 13 described in FIGURE 2. Suitable prongs 40 extend from the face 41 of the cable connector, this face 41 normally being of insulating material.

A shielding gasket 42 in accord with a further embodiment of the invention is shown in a position preparatory to being applied to the connector 38. This gasket includes suitable grounding tabs 43 and 44 extending from diametrically opposite sides as shown.

Figure 8:
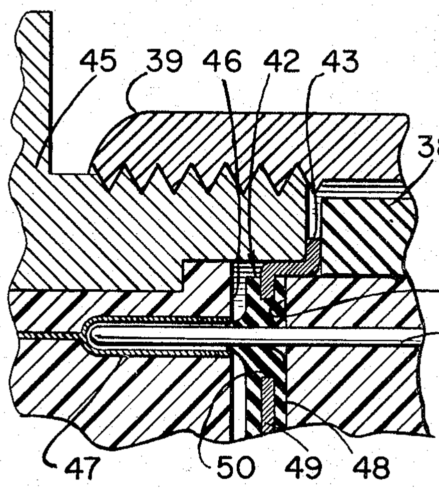
FIGURE 8 is an enlarged fragmentary cross section of the connector of FIGURE 7 in engagement with a further cable connector wherein the modified gasket is in proper position for shielding.

Referring to FIGURE 8, the manner in which the gasket 42 functions to effect high frequency shielding will be evident. As shown, when the connector 38 is received in a mating connector 45, similar to the panel connector 19 of FIGURE 2, the gasket 42 is sandwiched between the face 46 of the connector 45 and the opposing face 41 of the connector 38 with the socket portion 47 receiving the prong 40.

The construction of the gasket itself as illustrated in FIGURE 8 includes a basic insulating material such as rubber 48 sandwiching a metallic conducting sheet 49 provided with enlarged openings such as the opening 50 at properly spaced points to permit passage of the prongs 40 without engaging in metallic contact the metallic sheet 49. It will be noted that the elastomer 48 normally fills the openings in the sheet.

In operation, the gasket 42 is simply forced over the various prongs such as the prong 40 of FIGURE 7 so that the prongs will push through and rupture the rubber material 48. The entire male plug may then be received in the coupling plug 45, the various prongs fitting into the sockets as illustrated for the prong 40. The grounding tabs such as the tab 43 illustrated in FIGURE 8 is automatically bent and wedged between peripheral metallic portions of the two connectors so that an excellent grounding of the high frequency shielding conductor sheet 49 is effected.

The foregoing gasket structure is useful for preventing any radio frequency or other high frequency energy leakage from about the prong area between the opposed faces of the connectors as described. Such a gasket could readily be employed in the embodiment of FIGURE 2, in addition to the panel gasket described in detail.

From the foregoing description, it will be evident that the present invention has provided a greatly improved high frequency shielding gasket in which all of the various objects set forth are fully satisfied.

What is claimed is:

1. A high frequency shielding gasket comprising, in combination: a thin flexible sheet of conducting material having a central opening, the annular edge of said opening turning out of the plane of the remaining surface of said sheet and thence radially towards the center of said central opening to define an annular flat surface lying in a plane parallel to and spaced a given distance from the plane of said remaining surface; a first flat member of resilient sealing material of a thickness corresponding to said given distance secured to said remaining surface and having a central opening receiving and surrounding the out turned portion of said annular edge with the free surface of said first member being co-extensive with said flat annular surface; and a second member of resilient sealing material in the shape of a washer secured to the under-surface of said annular flat surface and of a thickness corresponding to said given distance with the free surface of said second member being co-extensive with the under-surface of said remaining surface of said sheet whereby said under-surface of said remaining surface of said sheet can effect full surface contact with a panel surface and said annular flat surface can effect full surface contact with a connector surface when said gasket is sandwiched between panel and connector surfaces, said first and second resilient members accommodating any unevenness in said panel and connector surfaces and providing a fluid tight seal, said sheet providing electrical conductivity over 360° between said panel and connector surfaces.

2. A gasket according to claim 1, in which at least one of said contacting surfaces of said sheet of conducting material is coated with an inert metal to avoid direct contact between dissimilar metals when said sheet is of a material different from the material of said panel or connector surface.

3. A gasket according to claim 1, in which portions of said remaining surface include screw openings for receiving screws used to secure said connector to said panel, the diameter of said screw openings being less than the external diameter of screws receivable therethrough whereby a force screw threading results to assure 360° contact of said remaining surface with said screws.

References Cited

UNITED STATES PATENTS

| | | | |
|---|---|---|---|
| 2,045,547 | 6/1936 | Chatfield | 174—94 |
| 2,190,824 | 2/1940 | Cook | 174—94 X |
| 2,407,076 | 9/1946 | Harkness | 174—35 |
| 2,454,567 | 11/1948 | Pierson | 174—35 |
| 3,171,887 | 3/1965 | Cross | 174—35 |
| 3,278,883 | 11/1966 | Lipsey | 174—78 X |

DARRELL L. CLAY, *Primary Examiner.*